United States Patent
Shieh et al.

(10) Patent No.: US 8,962,990 B2
(45) Date of Patent: Feb. 24, 2015

(54) MULTILAYER COMPOSITION CONTAINING FLUOROPOLYMER AND METHOD FOR FABRICATING THE SAME, AND SOLAR CELL MODULE

(75) Inventors: Tien-Shou Shieh, Taipei (TW); Chia-Chi Huang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 258 days.

(21) Appl. No.: 13/444,794

(22) Filed: Apr. 11, 2012

(65) Prior Publication Data

US 2013/0068303 A1    Mar. 21, 2013

(30) Foreign Application Priority Data

Sep. 19, 2011   (TW) .............................. 100133576 A

(51) Int. Cl.
*H01L 31/00* (2006.01)
*H01L 31/048* (2014.01)
*B32B 7/12* (2006.01)
*B32B 37/12* (2006.01)
*B32B 27/08* (2006.01)
*B32B 27/30* (2006.01)
*B32B 27/36* (2006.01)

(52) U.S. Cl.
CPC ........ *H01L 31/0481* (2013.01); *H01L 31/0487* (2013.01); *B32B 7/12* (2013.01); *B32B 37/12* (2013.01); *B32B 27/08* (2013.01); *B32B 27/306* (2013.01); *B32B 27/36* (2013.01); *B32B 2250/02* (2013.01); *B32B 2250/24* (2013.01); *B32B 2255/10* (2013.01); *B32B 2255/26* (2013.01); *B32B 2264/102* (2013.01); *B32B 2307/31* (2013.01); *B32B 2307/71* (2013.01); *B32B 2307/712* (2013.01); *B32B 2457/12* (2013.01); *B32B 2309/02* (2013.01); *B32B 2309/04* (2013.01); *B32B 2309/105* (2013.01); *B32B 2327/12* (2013.01); *Y02E 10/50* (2013.01)
USPC ........................................... 136/259; 136/251

(58) Field of Classification Search
CPC .... H01L 31/0487; H01L 31/0481; B32B 7/12
USPC ................................ 136/251, 259; 428/474.4
See application file for complete search history.

(56) References Cited

U.S. PATENT DOCUMENTS 4,793,886 A * 12/1988 Okamura et al. .......... 156/307.3
5,656,121 A *  8/1997 Fukushi ........................ 156/326

(Continued)

FOREIGN PATENT DOCUMENTS

| CA | 2195790 | 2/1996 |
|----|---------|--------|
| CA | 2196299 | 2/1996 |

(Continued)

OTHER PUBLICATIONS

Taiwan Patent Office, Office Action, Patent Application Serial No. 100133576, Nov. 7, 2013, Taiwan.

*Primary Examiner* — Allison Bourke

(57) ABSTRACT

The disclosure provides a multilayer composition containing fluoropolymer and method for fabricating the same, and a solar cell module. The multilayer composition includes: a fluoropolymer layer; a non-fluorinated polymer layer; and an adhesion promoter layer formed between the fluoropolymer layer and the non-fluorinated polymer layer, wherein the adhesion promoter layer includes aromatic diamines or aromatic polyamines.

4 Claims, 1 Drawing Sheet

(56) References Cited

U.S. PATENT DOCUMENTS

| | | |
|---|---|---|
| 5,658,670 A | 8/1997 | Fukushi et al. |
| 5,827,587 A | 10/1998 | Fukushi |
| 5,855,977 A | 1/1999 | Fukushi et al. |
| 6,074,719 A | 6/2000 | Fukushi et al. |
| 6,451,925 B2 | 9/2002 | Jing |
| 6,962,754 B2 | 11/2005 | Bussi et al. |
| 2001/0049408 A1 | 12/2001 | Jing |
| 2006/0083882 A1 | 4/2006 | Schmitz et al. |
| 2008/0216889 A1* | 9/2008 | Blong et al. .......... 136/251 |

FOREIGN PATENT DOCUMENTS

| | | |
|---|---|---|
| CN | 1155260 | 7/1997 |
| DE | 69523930 T2 | 2/1996 |
| EP | 0777577 A1 | 6/1997 |
| EP | 0777578 A1 | 6/1997 |
| EP | 1165669 A1 | 1/2002 |
| JP | 08259716 | 10/1996 |
| JP | 10504595 | 5/1998 |
| JP | 10504601 | 5/1998 |
| JP | 2002538251 | 11/2002 |
| WO | WO 9605964 | 2/1996 |
| WO | WO 9605965 | 2/1996 |
| WO | WO 9808679 | 3/1998 |
| WO | WO 0052084 | 9/2000 |

* cited by examiner

MULTILAYER COMPOSITION CONTAINING FLUOROPOLYMER AND METHOD FOR FABRICATING THE SAME, AND SOLAR CELL MODULE

CROSS REFERENCE TO RELATED APPLICATIONS

This Application claims priority of Taiwan Patent Application No. 100133576, filed on Sep. 19, 2011, the entirety of which is incorporated by reference herein.

TECHNICAL FIELD

The technical field relates to a multilayer composition, and in particular relates to a multilayer composition containing a fluoropolymer.

BACKGROUND

Development in the solar cell industry is driven by global environmental concerns and rising raw material prices.

The solar cell module comprises a front plate, a solar cell, a sealing material and a back plate. The back plate is often formed by several layers. For example, a back plate is formed by the following steps. A polyethylene terephthalate (PET) is used as a substrate and a fluoropolymer layer is coated on the PET substrate, and then a sealing material (such as ethylene vinyl acetate copolymer (EVA) is adhered to the fluoropolymer layer. However, poor adhesion exists in-between the ethylene vinyl acetate copolymer (EVA) and the fluoropolymer layer.

U.S. Pat. No. 6,074,719 provides a multilayer composition containing a fluoropolymer. An aliphatic diamine or aliphatic polyamine (molecular weight smaller than 1,000) is coated on a substrate, and then a fluoropolymer and the substrate are hot pressed at high temperature to form the multilayer composition.

However, when the aliphatic diamine or aliphatic polyamine is used as an adhesion promoter layer, an unwanted yellowing phenomenon may occur in the fluoropolymer layer, and the fluoropolymer layer is easily peeled off from the substrate.

Therefore, there is a need to develop a multilayer composition containing a fluoropolymer to prevent the yellowing phenomenon and peeling off problem.

SUMMARY

The disclosure provides a multilayer composition containing fluoropolymer and method for fabricating the same, and a solar cell module. The multilayer composition includes: a fluoropolymer layer; a non-fluorinated polymer layer; and an adhesion promoter layer formed between the fluoropolymer layer and the non-fluorinated polymer layer, wherein the adhesion promoter layer includes aromatic diamines or aromatic polyamines.

The disclosure also provides a method for fabricating a multilayer composition containing fluoropolymer, comprising: (a) providing a fluoropolymer layer and a non-fluorinated polymer layer; (b) forming an adhesion promoter layer between the fluoropolymer layer and the non-fluorinated polymer layer, wherein the adhesion promoter layer comprises aromatic diamines or aromatic polyamines; and (c) hot pressing the adhesion promoter layer, the fluoropolymer layer and the non-fluorinated polymer layer to form the adhesion promoter layer between the fluoropolymer layer and the non-fluorinated polymer layer.

The disclosure yet provides a solar cell module, comprising: a front plate and a back plate, wherein the back plate comprises a fluoropolymer layer; a solar cell formed between the front plate and the back plate; a first sealing material and a second sealing material, the first sealing material is formed between the back plate and the solar cell, and the second sealing material is formed between the front plate and the solar cell; and an adhesion promoter layer formed between the fluoropolymer layer of the back plate and the first sealing material, wherein the adhesion promoter layer comprises aromatic diamines or aromatic polyamines.

A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

Figure 1:
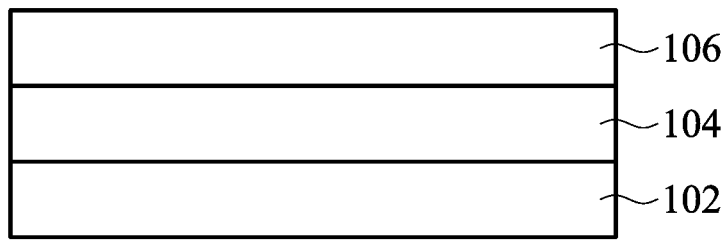
FIG. 1 shows a cross-sectional schematic representation of a multilayer composition containing a fluoropolymer in accordance with an embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Referring to FIG. 1, the disclosure provides a multilayer composition containing a fluoropolymer, wherein the multilayer composition 100 comprises a fluoropolymer layer 102 with a thickness of about 20-100 μm; a non-fluorinated polymer layer 106 with a thickness of about 100-800 μm; and an adhesion promoter layer 104 with a thickness of about 0.1-10 μm or 1-5 μm formed between the fluoropolymer layer 102 and the non-fluorinated polymer layer 106. The adhesion promoter layer 104 comprises aromatic diamines or aromatic polyamines which have a melting point larger than room temperature (about 20-25° C.). In one embodiment, the aromatic diamines or aromatic polyamines have a molecular weight of about 100-400 g/mol or 100-300 g/mol.

Note that in prior art, the aliphatic diamines or aliphatic polyamines are used as the adhesion promoter layer. However, the chemical bonds of the aliphatic diamines or aliphatic polyamines are easily broken at high temperature, and thus an unwanted yellowing phenomenon may occur in the fluoropolymer layer. Compared with the prior art, the structure of the adhesion promoter layer 104 of the disclosure has the aromatic group, and thus the molecular interactions between the aromatic diamines or aromatic polyamines are stronger than that of the aliphatic diamines or aliphatic polyamines. Therefore, the adhesion promoter layer 104 is stable to prevent the yellowing phenomenon.

The fluoropolymer layer 102 comprises poly(chlorotrifluoroethylene), poly(tetrafluoroethene), tetrafluoroethylene hexafluoropropylene copolymer, poly(vinylidene fluoride or fluorosilane polymer.

The non-fluorinated polymer layer 106 comprises ethylene vinyl acetate copolymer (EVA), polyamide, polyimide, polyurethane or polyolefine, wherein the polyolefine comprises a carboxyl group, anhydride group or imide group.

The aromatic diamines or aromatic polyamines comprise m-phenylenediamine, 4,4'-diaminodiphenyl sulfone, 4-Aminobenzenesulfonamide, 4,4'-diaminodiphenyl ether, 4,4'-(1,3-phenylenedioxy)dianiline, 4,4'-diaminodiphenyl methane or derivatives thereof.

The disclosure also provides a method for fabricating a multilayer composition containing fluoropolymer. Referring to FIG. 1, the method comprises step (a) to step (c). In the step (a), the fluoropolymer layer 102 and the non-fluorinated polymer layer 106 are provided. The material of the fluoropolymer layer 102 and the non-fluorinated polymer layer 106 are described above, and thus are omitted for brevity.

Then, in step (b), the adhesion promoter layer 104 is formed between the fluoropolymer layer 102 and the non-fluorinated polymer layer 106. The adhesion promoter layer 104 comprises aromatic diamines or aromatic polyamines. The adhesion promoter layer 104 is formed by a coating, spraying or dipping method.

Next, in step (c), the adhesion promoter layer 104, the fluoropolymer layer 102 and the non-fluorinated polymer layer 106 are hot pressed to form the adhesion promoter layer 104 between the fluoropolymer layer 102 and the non-fluorinated polymer layer 106.

The multilayer composition of the disclosure by the above fabricating method has no yellowing phenomenon when checked by the naked eye. The peel strength of the adhesion promoter layer 106 of the disclosure is measured by ASTM 1876-01 (T-peel Test). The data shows that the peel strength of the adhesion promoter layer of the disclosure is larger than 18 kg. Thus, the adhesion between the fluoropolymer layer 102 and the non-fluorinated polymer layer 106 is indeed improved by the help of the adhesion promoter layer 106 of the disclosure.

Figure 2:
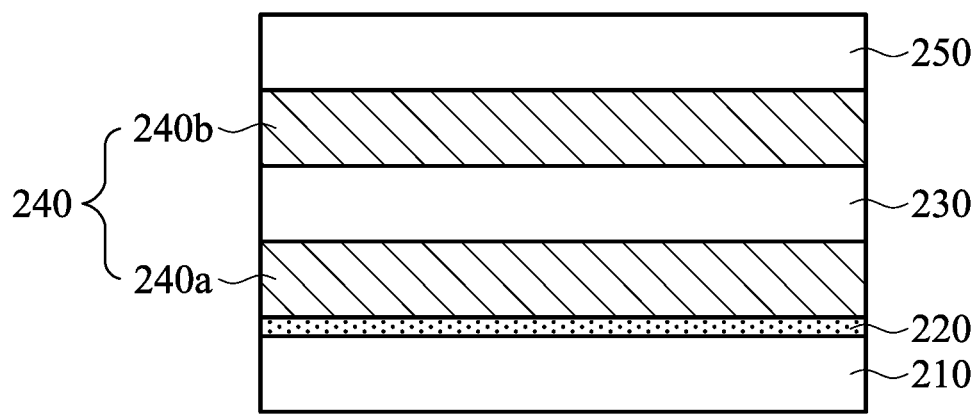
FIG. 2 shows a cross-sectional schematic representation of a solar cell module in accordance with an embodiment of the disclosure.

Meanwhile, referring to FIG. 2, the disclosure yet provides a solar cell module 200. The solar cell module 200 comprises (from bottom to top): a back plate 210, an adhesion promoter layer 220, a first sealing material 240a, a solar cell 230, a second sealing material 240b and a front plate 250. The front plate 250 is used to face the sunlight, and thus it is often made by glass material. The back plate 210 is not needed to face sunlight and it comprises the fluoropolymer layer.

In one embodiment, the back plate 210 may comprise polyfluoroethylene/PET/polyfluoroethylene (also called TPT structure).

The solar cell 230 may comprise a monocrystal silicon solar cell, polycrystalline silicon solar cell, thin film solar cell or dye-sensitized solar cell.

The sealing material 240 comprises a first sealing material 240a and a second sealing material 240b, and each of them independently comprises ethylene vinyl acetate copolymer, polyamide, polyimide, polyurethane or polyolefine. The sealing material 240 is made by a non-fluorinated polymer material. The adhesion promoter layer 220 is formed between the fluoropolymer layer of the back palter 210 and the first sealing material 240a. In other words, the adhesion promoter layer 220 is formed between the fluoropolymer layer and the non-fluorinated polymer layer.

The adhesion promoter layer 220 comprises the aromatic diamines or aromatic polyamines, such as m-phenylenediamine, 4,4'-diaminodiphenyl sulfone, 4-Aminobenzenesulfonamide, 4,4'-diaminodiphenyl ether, 4,4'-(1,3-phenylenedioxy)dianiline, 4,4'-diaminodiphenyl methane or derivatives thereof.

From the above description, the function of the aromatic diamines or aromatic polyamines of the adhesion promoter layer of the disclosure is not only to improve the adhesion between the fluoropolymer layer and the non-fluorinated polymer layer, but also to prevent the yellowing phenomenon. Therefore, the lifetime of the solar cell module may be improved by the help of the adhesion promoter layer.

EXAMPLE

Example 1-5

Referring to Table 1, the adhesion promoter layers of Example 1-5 were dissolved in methanol to form the methanol solution with a different concentration. The methanol solution was coated on a 10 cm×10 cm of a substrate containing the fluoropolymer layer (the fluoropolymer layer was made by a 20 μm fluorine-siloxane polymer coating on a 188 μm PET, and the fluorine-siloxane polymer was doped with 15 wt % $TiO_2$, and the fluorine-siloxane polymer had a average molecular weight of about 10,000 g/mol).

The substrate was put in an oven at 40° C. for 30 minutes to remove the solvent. Then, an ethylene vinyl acetate copolymer (EVA) (400-600 trade name RC02B, Manufactured by Mitsui Chemicals, Inc.) was put on the substrate. The EVA and the substrate were pressed at 150° C. at 100 Kpa for 30 minutes or 1 hour. After removing the pressure, the substrate was cooled down to room temperature to obtain a multilayer composition.

Referring to Table 1, the degree of the yellowing phenomenon was checked by the naked eye, and the Example 1-Example 5 had no yellowing phenomenon. Additionally, the peel strength of Example 1-Example 5 (2.5 cm×8 cm) was measured by an ASTM 1876-01 (T-peel Test). The data shows that the peel strength of Example 1-Example 5 was about 18-24 kg.

TABLE 1

| | Example 1 | Example 2 | Example 3 | Example 4 | | Example 5 |
|---|---|---|---|---|---|---|
| Adhesion promoter layer | MPDA | MPDA | ABS | ABS | | DDS |
| Concentration (%) | 5 | 3 | 5 | 1 | | 3 |
| Thickness (μm) | 5 | 3 | 5 | 1 | | 3 |
| Hot pressing time (Min.) | 30 | 30 | 30 | 30 | 60 | 30 |
| Adhesion strength (Kg) | 20.6 | 23.8 | 19.8 | 20.9 | 18.1 | 19.3 |
| yellowing phenomenon | ⊕ | ⊕ | ⊕ | ⊕ | ⊕ | ⊕ |

MPDA: m-phenylenediamine
ABS: 4-aminobenzenesulfonamide
DDS: 4,4'-diaminodiphenyl sulfone
yellowing phenomenon: ⊕: indicating no yellowing phenomenon; Δ: indicating a little yellowing but not obviously; X: indicating yellowing obviously

Comparative Example 1-4

Table 2 shows the adhesion strength and the degree of the yellowing phenomenon of Comparative Example 1-4. The fabricating method of Comparative Example 1-4 is like that of Example 1-5.

Comparative Example 1: there was no adhesion promoter layer on the substrate containing the fluoropolymer layer. Then, the fluoropolymer of the substrate was directly hot pressed with EVA.

Comparative Example 2: the methanol was coated on the substrate containing the fluoropolymer layer. Then, after removing the solvent, the fluoropolymer of the substrate and EVA were hot pressed.

Comparative Example 3-4: the fabricating method is like the Example 1-5, except that the material of the adhesion promoter layer is different.

Compared with Table 1 and Table 2, the adhesion promoter layer of the disclosure not only improves the adhesion between the fluoropolymer layer and the non-fluorinated polymer layer, but also prevents the yellowing phenomenon.

TABLE 2

|  | Comparative Example 1 | Comparative Example 2 | Comparative Example 3 | Comparative Example 4 |
|---|---|---|---|---|
| Adhesion promoter layer | — | MeOH | HDMA | DMDA |
| Concentration (%) | — | 0 | 5 | 3 |
| Hot pressing time (Min.) | 30 | 30 | 60 | 30 |
| Adhesion strength (Kg) | 7.0 | 7.2 | 14.0 | 15.4 |
| yellowing phenomenon | ⊕ | ⊕ | x | x |

HDMA: hexamethylenediamine
DMDA: dodecamethylenediamine

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A solar cell module, comprising:
   a front plate and a back plate, wherein the back plate comprises a fluoropolymer layer;
   a solar cell formed between the front plate and the back plate;
   a first sealing material and a second sealing material, the first sealing material is formed between the back plate and the solar cell, the second sealing material is formed between the front plate and the solar cell and the first sealing material comprises a non-fluorinated polymer layer; and
   an adhesion promoter layer formed between the fluoropolymer layer and the non-fluorinated polymer layer, wherein the adhesion promoter layer consists of aromatic diamines or aromatic polyamines.

2. The solar cell module as claimed in claim 1, wherein the first sealing material comprises ethylene vinyl acetate copolymer, polyamide, polyimide, polyurethane or polyolefine.

3. The solar cell module as claimed in claim 1, wherein the second sealing material comprises ethylene vinyl acetate copolymer, polyamide, polyimide, polyurethane or polyolefine.

4. The solar cell module as claimed in claim 1, wherein the aromatic diamines or aromatic polyamines comprise m-phenylenediamine, 4,4'-diaminodiphenyl sulfone, 4-Aminobenzenesulfonamide, 4,4'-diaminodiphenyl ether, 4,4'-(1,3-phenylenedioxy)dianiline, 4,4'-diaminodiphenyl methane or derivatives thereof.

* * * * *